(12) United States Patent
Kim et al.

(10) Patent No.: US 9,177,793 B2
(45) Date of Patent: Nov. 3, 2015

(54) METHODS OF FABRICATING A SEMICONDUCTOR DEVICE

(71) Applicant: SAMSUNG ELECTRONICS CO., LTD., Suwon-si, Gyeonggi-do (KR)

(72) Inventors: Hyongsoo Kim, Hwaseong-si (KR); Joon Kim, Seoul (KR); WonSeok Yoo, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 132 days.

(21) Appl. No.: 13/953,917

(22) Filed: Jul. 30, 2013

(65) Prior Publication Data

US 2014/0030867 A1    Jan. 30, 2014

(30) Foreign Application Priority Data

Jul. 30, 2012    (KR) .................. 10-2012-0083377

(51) Int. Cl.
| | |
|---|---|
| *H01L 21/00* | (2006.01) |
| *H01L 21/027* | (2006.01) |
| *H01L 21/033* | (2006.01) |
| *H01L 21/311* | (2006.01) |
| *H01L 23/544* | (2006.01) |
| *G03F 9/00* | (2006.01) |

(52) U.S. Cl.
CPC .............. *H01L 21/027* (2013.01); *G03F 9/708* (2013.01); *H01L 21/0274* (2013.01); *H01L 21/0337* (2013.01); *H01L 21/31144* (2013.01); *H01L 23/544* (2013.01); *H01L 2223/5446* (2013.01); *H01L 2223/54426* (2013.01)

(58) Field of Classification Search
None
See application file for complete search history.

(56) References Cited

U.S. PATENT DOCUMENTS

| | | | |
|---|---|---|---|
| 6,362,044 B1 | 3/2002 | Shimizu et al. | |
| 6,730,956 B2 * | 5/2004 | Bae et al. .................... | 257/306 |
| 6,815,308 B2 * | 11/2004 | Holscher et al. .............. | 438/401 |
| 7,202,127 B2 | 4/2007 | Busch et al. | |
| 2007/0037359 A1 * | 2/2007 | Jo ................................. | 438/401 |

FOREIGN PATENT DOCUMENTS

| | | |
|---|---|---|
| JP | 3643527 B2 | 4/2005 |
| KR | 10-2000-0074845 A | 12/2000 |
| KR | 10-2005-0050273 A | 5/2005 |
| KR | 10-2006-0114446 A | 11/2006 |
| KR | 10-2008-0011928 A | 2/2008 |
| KR | 10-2010-0111433 A | 10/2010 |

* cited by examiner

*Primary Examiner* — Sonya D McCall Shepard
(74) *Attorney, Agent, or Firm* — Lee & Morse, P.C.

(57) ABSTRACT

A method of fabricating a semiconductor device includes forming an etch-target layer on a substrate having an alignment key, forming a transparent first pattern on the etch-target layer to face the alignment key, forming an opaque second pattern on the etch-target layer to be adjacent to the first pattern, and etching the etch-target layer using the first pattern and the second pattern as an etch mask.

19 Claims, 13 Drawing Sheets

METHODS OF FABRICATING A SEMICONDUCTOR DEVICE

CROSS-REFERENCE TO RELATED APPLICATION

Korean Patent Application No. 10-2012-0083377, filed on Jul. 30, 2012, in the Korean Intellectual Property Office, and entitled: "METHODS OF FABRICATING A SEMICONDUCTOR DEVICE," is incorporated by reference herein in its entirety.

BACKGROUND

Embodiments relate to methods of fabricating a semiconductor device.

SUMMARY

Embodiments are directed to a method of fabricating a semiconductor device, including forming an etch-target layer on a substrate having an alignment key, forming a transparent first pattern on the etch-target layer to face the alignment key, forming an opaque second pattern on the etch-target layer to be adjacent to the first pattern, and etching the etch-target layer using the first pattern and the second pattern as an etch mask.

The first pattern may be formed to exhibit a refractive index of about 0.3 or less, when light of about 633 nm wavelength is incident thereto. The second pattern may be formed to exhibit a refractive index of about 3 or more, when light of about 633 nm wavelength is incident thereto.

The forming of the first pattern may include forming a mask layer containing an amorphous silicon layer, on the etch-target layer and thermally treating a portion of the mask layer facing the alignment key to transform a portion of the amorphous silicon layer to a polysilicon layer.

Thermally treating the portion of the mask layer may include providing an aperture mask on the mask layer to have an opening exposing the portion of the mask layer facing the alignment key, and selectively illuminating a laser beam onto the portion of the mask layer exposed by the opening.

Forming the second pattern may include patterning the mask layer containing the amorphous silicon layer.

Forming the first pattern may include forming a first mask layer including an amorphous silicon layer on the etch-target layer, thermally treating the first mask layer to transform the amorphous silicon layer to a polysilicon layer, and patterning the first mask layer to form the first pattern.

Thermally treating the first mask layer may be performed in a furnace.

Forming the second pattern may include forming a second mask layer on the etch-target layer to fill a gap between plural ones of the first pattern and to include an opaque amorphous silicon layer, and patterning the second mask layer to form the second pattern.

Forming the second pattern may include conformally forming a second mask layer including an amorphous silicon layer on the etch-target layer and plural ones of the first pattern, forming a sacrificial layer on the second mask layer, polishing the sacrificial layer to expose a top surface of the second mask layer, etching the exposed top surface of the second mask layer in an etch-back manner, etching the sacrificial layer in an etch-back manner, polishing the second mask layer to form a preliminary second pattern having a top surface that is coplanar with top surfaces of the plural ones of the first pattern, and patterning the preliminary second pattern to form the second pattern.

The method may further include forming a first etch stop layer, before the forming of the first mask layer, and forming a second etch stop layer, before the forming of the second mask layer.

The second pattern may be formed to be in contact with sidewalls of the plural ones of the first pattern.

Embodiments are also directed to a method of fabricating a semiconductor device, including forming an etch-target layer on a substrate including a first region provided with an alignment key and a second region to be provided with a semiconductor device, forming a mask pattern including transparent first pattern and a second pattern, the transparent first pattern covering a portion of the etch-target layer facing the alignment key and a second pattern being used to form the semiconductor device, etching the etch-target layer using the mask pattern as an etch mask to form a hole exposing a top surface of the substrate, removing the mask pattern.

The substrate may include a chip area and a scribe line area, the chip area including a cell region and a peripheral region. The first region may include at least a portion of the scribe line area or the peripheral region.

The first pattern may include a transparent polysilicon layer. The second pattern may include an opaque amorphous silicon layer.

The first pattern may be formed to exhibit refractive index of about 0.3 or less, when light of about 633 nm wavelength is incident thereto. The second pattern is formed to exhibit refractive index of about 3 or more, when light of about 633 nm wavelength is incident thereto Embodiments are also directed to a method of forming an etching mask including forming an amorphous silicon layer on a substrate having an alignment key, thermally treating the amorphous silicon layer to transform the amorphous silicon layer into a transparent polysilicon layer such that the alignment key becomes visible through the polysilicon layer, patterning to form a first pattern from the polysilicon layer, the first pattern facing the alignment key, and forming a second pattern of amorphous silicon, the second pattern being adjacent to first pattern.

Thermally treating the amorphous silicon layer may include selectively illuminating a laser beam onto a portion of the amorphous silicon layer facing the alignment key such that only the portion of the amorphous silicon layer facing the alignment key is transformed into the polysilicon layer. Forming the second pattern may include patterning a remaining portion of the amorphous silicon layer not thermally treated.

Thermally treating the amorphous silicon layer may include transforming an entire portion of the amorphous silicon layer into a transparent polysilicon layer. Patterning to form the first pattern may include removing portions of the polysilicon layer not facing the alignment key. Forming the second pattern may include depositing amorphous silicon on the substrate between plural ones of the first pattern and patterning the deposited amorphous silicon.

The method may further include forming an etch-target layer on the substrate having the alignment key before forming the opaque amorphous silicon layer.

The first pattern may be formed to exhibit a refractive index of about 0.3 or less, when light of about 633 nm wavelength is incident thereto. The second pattern may be formed to exhibit a refractive index of about 3 or more, when light of about 633 nm wavelength is incident thereto.

BRIEF DESCRIPTION OF THE DRAWINGS

Features will become apparent to those of ordinary skill in the art by describing in detail exemplary embodiments with reference to the attached drawings in which.

DETAILED DESCRIPTION

Example embodiments will now be described more fully hereinafter with reference to the accompanying drawings. It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature. Moreover, example embodiments may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1A:
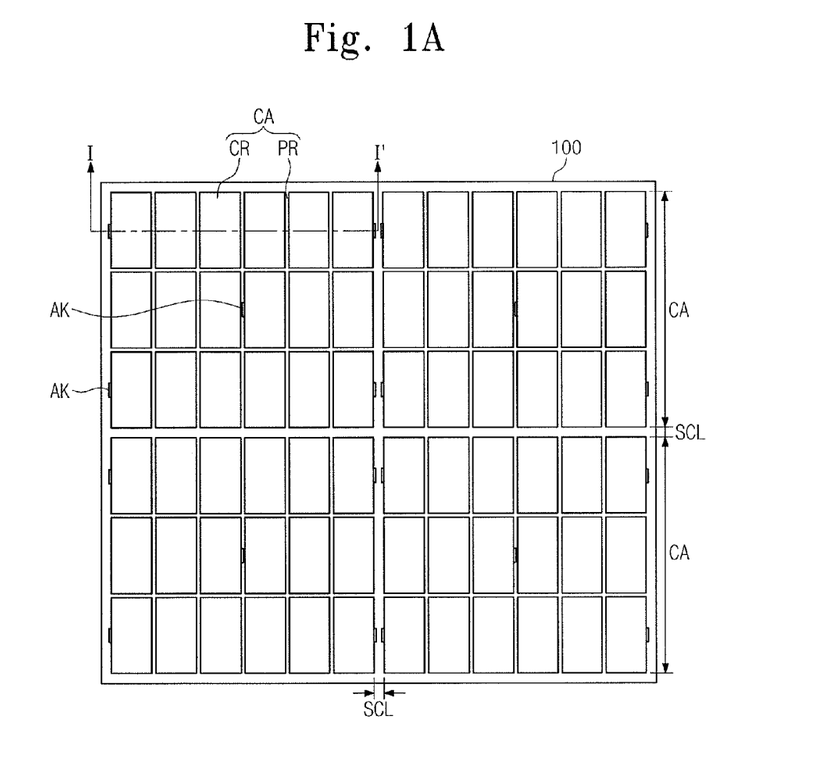
FIGS. 1A and 1B illustrate plan views showing stages of a process of fabricating a semiconductor device according to example embodiments.
Figure 1B:
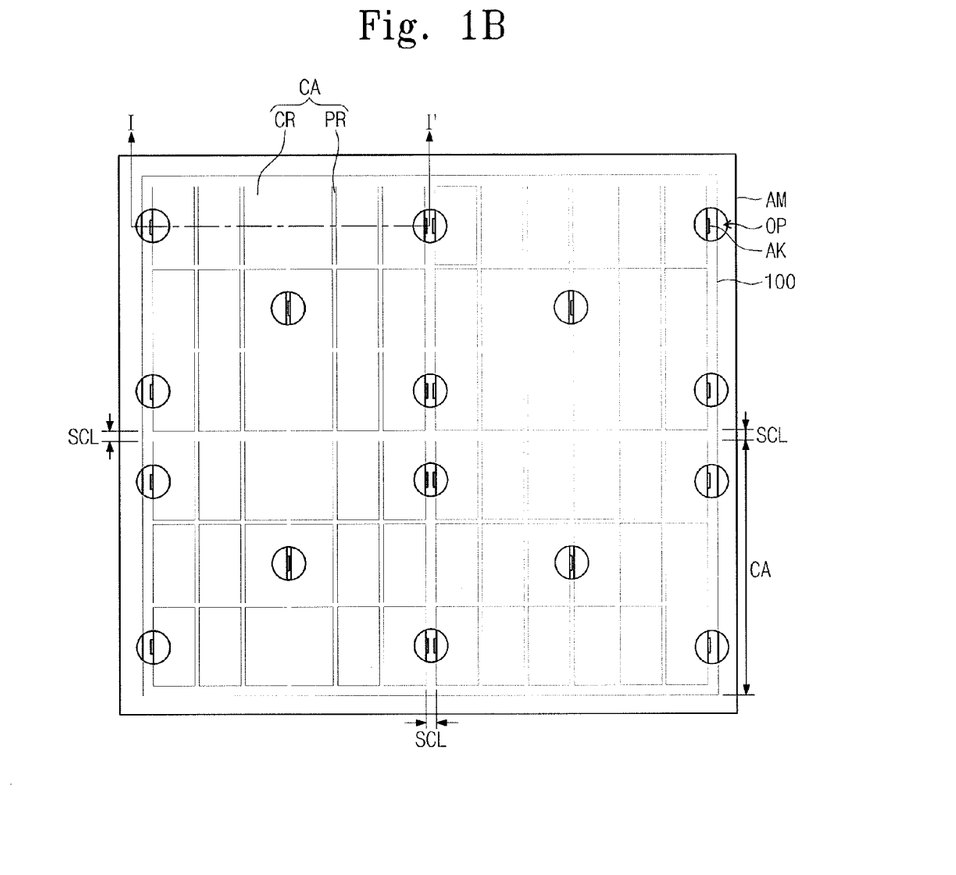

FIGS. 1A and 1B illustrate plan views showing stages of a process of fabricating a semiconductor device according to example embodiments. FIGS. 2A through 2F illustrate sectional views showing stages of a process of fabricating a semiconductor device according to example embodiments. For example, FIGS. 2A through 2F illustrate sectional views taken along a line I-I' of FIG. 1A or 1B.

Figure 2A:
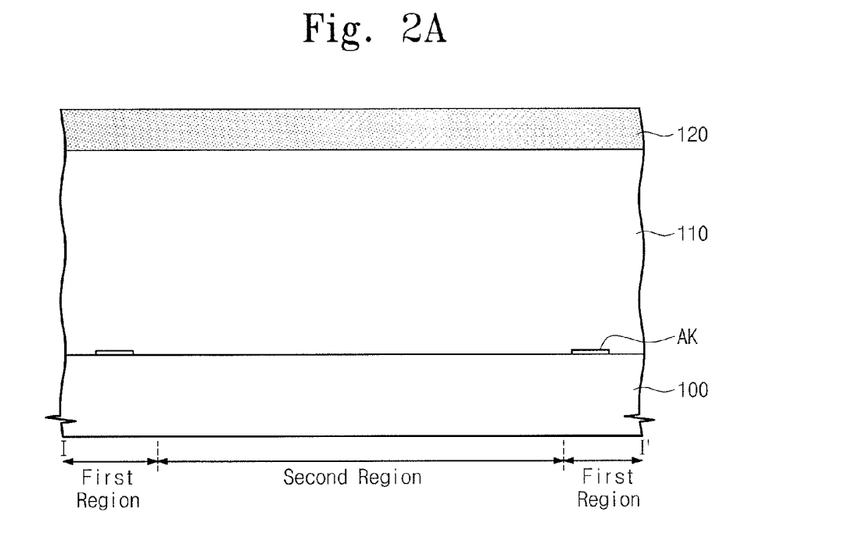
FIGS. 2A through 2F illustrate sectional views showing stages of a process of fabricating a semiconductor device according to example embodiments.

Referring to FIG. 1A, a substrate 100 provided with an alignment key AK is prepared. Referring to FIG. 2A, an insulating layer 110 and a mask layer 120 may be sequentially formed on the substrate 100.

The substrate 100 may include a first region to be provided with the alignment key AK and a second region to be provided with an integrated circuit. In example embodiments, the first region may include at least a portion of a scribe line area SCL. In addition, the first region may include at least a portion of a chip area CA. For example, in the case where the chip area CA may include a cell region CR and a peripheral region PR, the first region may include at least a portion of the peripheral region PR.

In a subsequent process (e.g., of etching the insulating layer 110), the alignment key AK may be used as a mark to form or align a mask to an intended position. Considering this purpose of the alignment key AK, layers to be stacked on the alignment key AK may be formed of transparent materials.

A shape of the alignment key AK may be various modified. For example, the alignment key AK may be shaped like a cell, a contact, or a trench.

In example embodiments, the insulating layer 110 may include a transparent insulating material. For example, the insulating layer 110 may include nitride, oxide and/or oxynitride. The insulating layer 110 may be formed on the whole top surface of the substrate 100.

In example embodiments, the insulating layer 110 may be partially etched in a subsequent process to form a cylindrical capacitor (not shown). In order to increase capacitance of the capacitor, the capacitor may be formed to have a high aspect ratio. For this, the insulating layer 110 may be formed to be thick. Although not shown in detail, a transistor including a gate insulating layer, a gate electrode, and first and second impurity regions may be formed on the substrate 100, before the formation of the insulating layer 110. In addition, a bit line may be formed on the substrate 100 to be electrically connected to the first impurity region. A contact plug may be further formed to be electrically connected to the second impurity region. The insulating layer 110 may be formed to cover the transistor, the bit line and the contact plug.

Although the capacitor may be exemplarily explained in the present embodiment, example embodiments may be applied to other etching processes for forming a structure having a high aspect ratio.

The mask layer 120 may include an amorphous silicon layer. Here, the term "amorphous silicon layer" for the mask layer 120 should be understood to include an opaque polysilicon layer in which grains have a small size. The mask layer 120 may be opaque and thus, may prevent the alignment key AK located below the insulating layer 110 from being visually inspected.

In example embodiments, the mask layer 120 may exhibit refractive index of about 3.0 or more, when a light of about 633 nm wavelength is incident thereto.

Figure 2B:
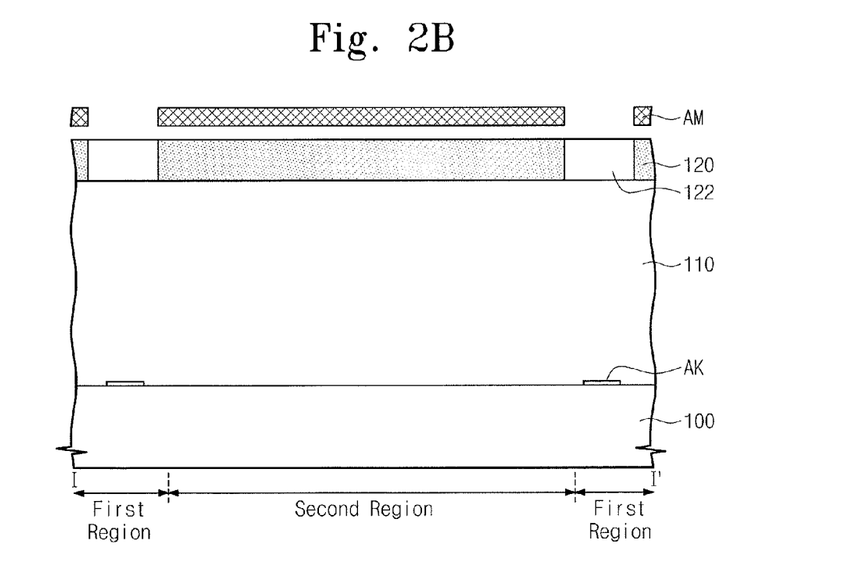

Referring to FIGS. 1B and 2B, a laser thermal treatment using an aperture mask AM may be performed on a portion of the mask layer 120 to form a transparent first pattern 122.

The aperture mask AM may be formed to have an opening. The opening of the aperture mask AM may be formed to expose optically a portion of the mask layer 120 located on the alignment key AK. In example embodiments, the opening may be formed to have a size greater than that of the alignment key AK. For example, if the opening of the aperture mask AM is formed to expose the alignment key AK disposed on the scribe line area SCL, it may also expose a portion of the chip area CA. In addition, if the opening of the aperture mask AM is formed to expose the alignment key AK disposed on the peripheral region PR of the chip area CA, it may also expose a portion of the cell region CR.

In example embodiments, the aperture mask AM may be provided spaced apart from the mask layer 120. In other example embodiments, the aperture mask AM may be provided to be in direct contact with a top surface of the mask layer 120.

A laser may be incident to the mask layer 120 exposed by the opening of the aperture mask AM; that is, a localized thermal treatment may be performed to the mask layer 120. The laser thermal treatment may be performed with a laser having a power ranging from about 0.5 J/cm$^2$ to about 6.0 J/cm$^2$.

As the result of the laser thermal treatment, the mask layer 120 exposed by the opening may be crystallized to form a polysilicon layer. For example, silicon grains of the mask layer 120 may have an increased size due to the laser thermal treatment and thus may form the first pattern 122 of a transparent polysilicon layer.

Due to the presence of the transparent first pattern 122, the alignment key AK may become visible.

Although not shown in detail, the first pattern 122 may have an un-even surface, as the result of the crystallization of the amorphous silicon layer of the mask layer 120.

In example embodiments, the first pattern 122 may exhibit refractive index of about 0.3 or less, when a light of about 633 nm wavelength is incident thereto.

According to example embodiments, the localized laser thermal treatment using the aperture mask AM may be used to transform the amorphous silicon layer of the mask layer 120 to the transparent polysilicon layer. Accordingly, the alignment key AK may be exposed by an easy and cheap process.

Figure 2C:
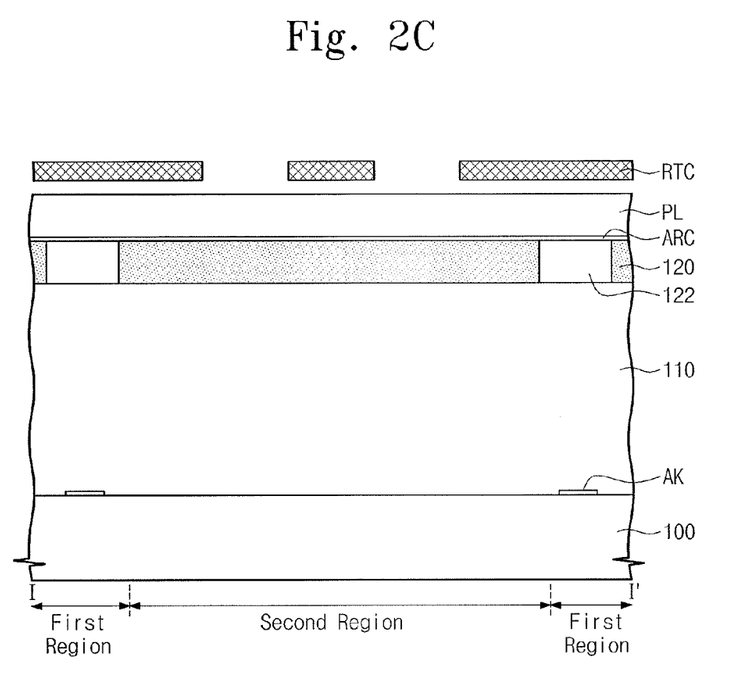
Figure 2D:
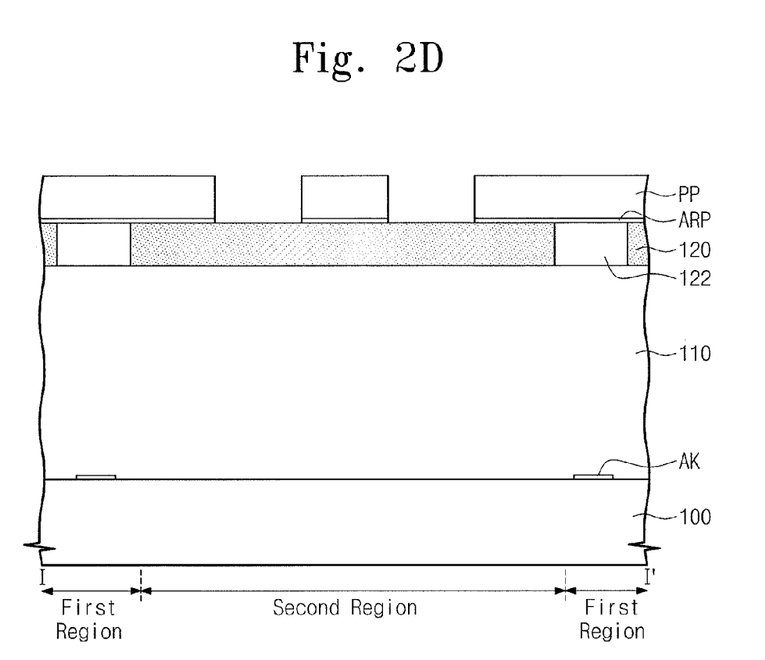

Referring to FIGS. 2C and 2D, an anti-reflection coating ARC and a photoresist layer PL may be sequentially formed on the mask layer 120, and then, an exposure and developing processes may be performed to the photoresist layer PL to form a photoresist pattern PP.

During the exposure process, the photoresist layer PL may be exposed using a reticle RTC that is aligned with the photoresist layer PL, and the alignment between the reticle RTC and the photoresist layer PL may be performed using the alignment key AK that can be optically seen through the first pattern 122.

In example embodiments, the exposed portion of the photoresist layer PL may be removed during the developing process, but other implementations, the exposed portion of the photoresist layer PL may remain and an un-exposed portion of the photoresist layer PL may be removed in the developing process.

Figure 2E:
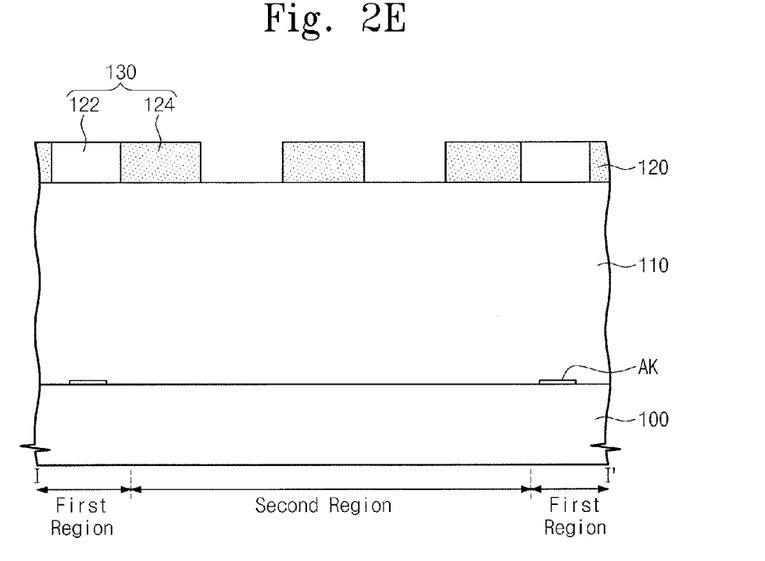

Referring to FIG. 2E, the anti-reflection coating ARC and the mask layer 120 may be etched using the photoresist pattern PP to form a mask pattern 130.

In example embodiments, the mask pattern 130 may include the first pattern 122 containing the polysilicon layer and a second pattern 124 containing the amorphous silicon layer. The first and second patterns 120 and 124 of the mask pattern 130 may serve as an etch mask for forming a hole (e.g., 126 in FIG. 2F) in the insulating layer 110. Here, as described above, the first pattern 122 of the mask pattern 130 may serve as a window, through which the alignment key AK provided below the insulating layer 110 can be seen.

The insulating layer 110 may be formed thick to increase capacitance of a capacitor to be formed in a subsequent process. The mask pattern 130 may be formed to have an etch selectivity or etch resistance with respect to an etchant that will be used to etch the insulating layer 110 and expose a portion of the substrate 100, so that a portion of the insulating layer 110 covered with the mask pattern 130 may be prevented from being etched during the etching of the insulating layer 110. As a thickness of the insulating layer 110 increases, it is desirable that the mask pattern 130 have an increased etch-resistance with respect to the etchant. In example embodiments, since the mask pattern 130 contains the amorphous and poly silicon layers, the mask pattern may satisfy the desired increase in etch-resistance.

As described above, the mask pattern 130 may include the transparent first pattern 122 and the opaque second pattern 124. The first pattern 122 may have an uneven surface. The first pattern 122 may be formed of a transparent material allowing an optical observation of the alignment key AK. By contrast, the second pattern 124 may be opaque, but may have an even surface and may serve as an etch mask.

An etching process may be affected by a sidewall profile of the mask pattern 130. According to example embodiments, as shown in drawings, the first pattern 122 having the uneven surface may not be exposed during the etching process, thereby hindering or preventing a process failure from occurring during the etching process. In addition, the alignment key AK may be optically observed through the first pattern 122. Accordingly, the alignment for the etching process can be properly performed.

In example embodiments, the photoresist pattern PP and the anti-reflection pattern ARP may be removed after the formation of the mask pattern 130.

Figure 2F:
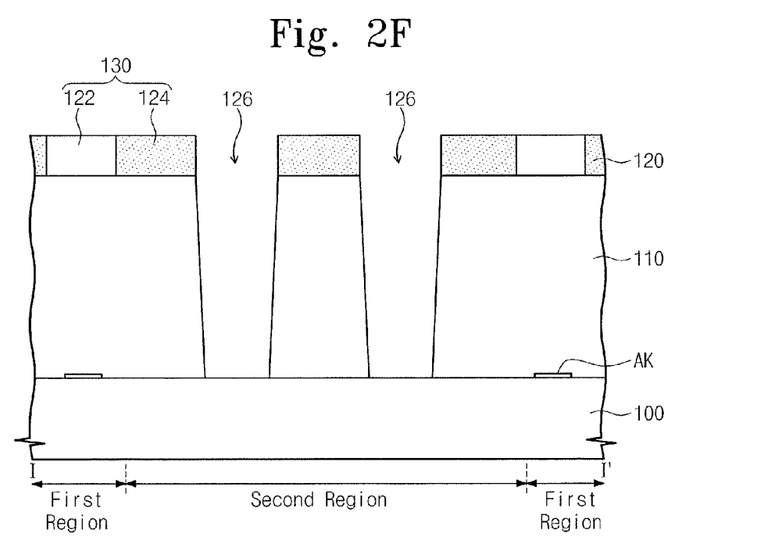

Referring to FIG. 2F, the insulating layer 110 may be etched using the mask pattern 130 to form a hole 126. The hole 126 may be formed to expose a portion of the substrate 100. In example embodiments, the hole 126 may be formed at a portion of the second region (or a region where semiconductor devices will be formed).

In example embodiments, the photoresist pattern PP and the anti-reflection pattern ARP may be removed after the formation of the hole 126.

FIGS. 3A through 3I illustrate sectional views showing stages of a process of fabricating a semiconductor device according to other example embodiments. For example, FIGS. 3A through 3I illustrate sectional views taken along a line I-I' of FIG. 1A or 1B.

Figure 3A:
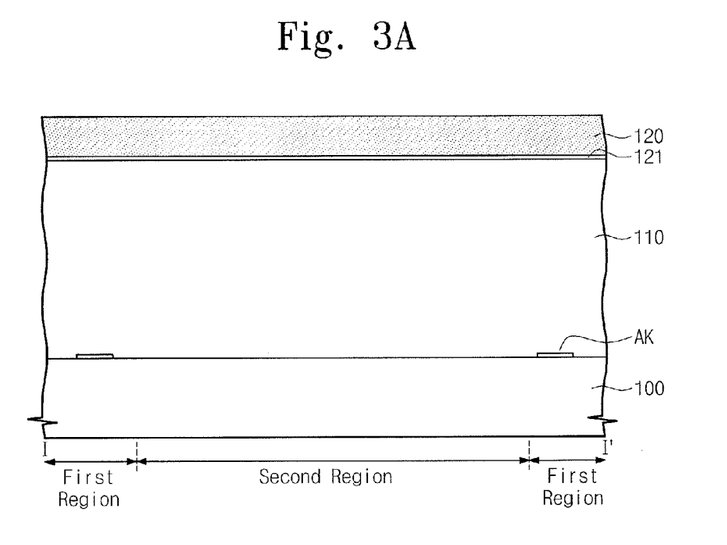
FIGS. 3A through 3I illustrate sectional views showing stages of a process of fabricating a semiconductor device according to other example embodiments.

Referring to FIG. 3A, the insulating layer 110, a first etch stop layer 121, and the first mask layer 120 may be formed on the substrate 100.

The first etch stop layer 121 may include a material having an etch selectivity with respect to an etchant that will be used to etch the insulating layer 110 and the first mask layer 120. Further, the first etch stop layer 121 may include a transparent material. For example, in the case where the insulating layer 110 includes a silicon oxide layer, the first etch stop layer 121 may include a silicon oxynitride layer. The first mask layer 120 may include an opaque amorphous silicon layer.

The substrate 100, the insulating layer 110 and the first mask layer 120 may be configured to have substantially the same features as those of the previous embodiments described with reference to FIGS. 1A and 2A, and a detailed description thereof will not be repeated.

Figure 3B:
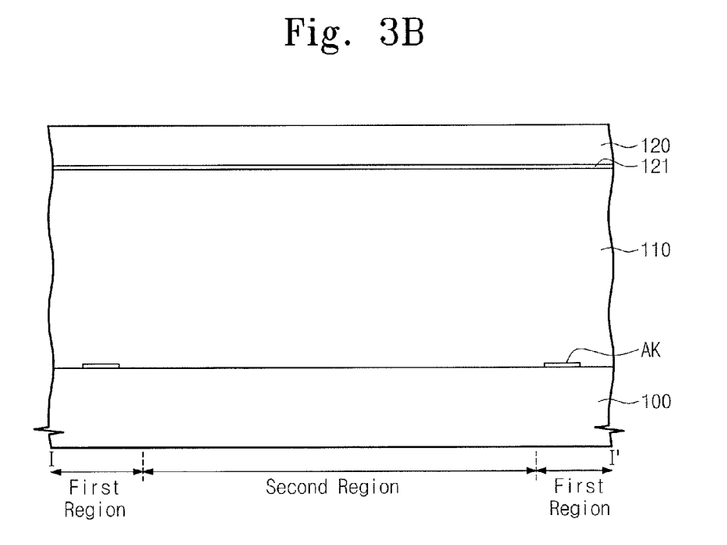

Referring to FIG. 3B, the first mask layer 120 may be thermally treated to transform the amorphous silicon layer to a polysilicon layer. As the result of the thermal treatment, the first mask layer 120 may be transformed into a transparent polysilicon layer.

In example embodiments, the thermal treatment may be performed at a furnace heated to a temperature of about 600° C. to about 900° C. The thermal treatment may be performing by a rapid thermal processing (RTP) or a rapid thermal annealing (RTA).

Although not shown in detail, the first mask layer 120 may have an uneven surface as a result of the thermal treatment.

According to example embodiments, the first mask layer 120 may exhibit refractive index of about 0.3 or less, when a light of about 633 nm wavelength is incident thereto.

Figure 3C:
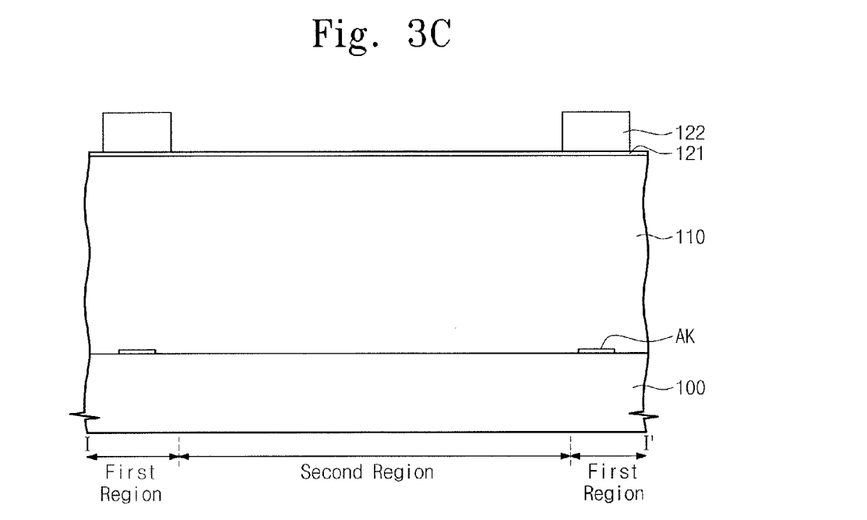

Referring to FIG. 3C, the first mask layer 120 may be etched to form the first pattern 122 locally provided over the alignment key AK. Due to the presence of the first etch stop layer 121, the insulating layer 110 may not be etched during the formation of the first pattern 122.

Figure 3D:
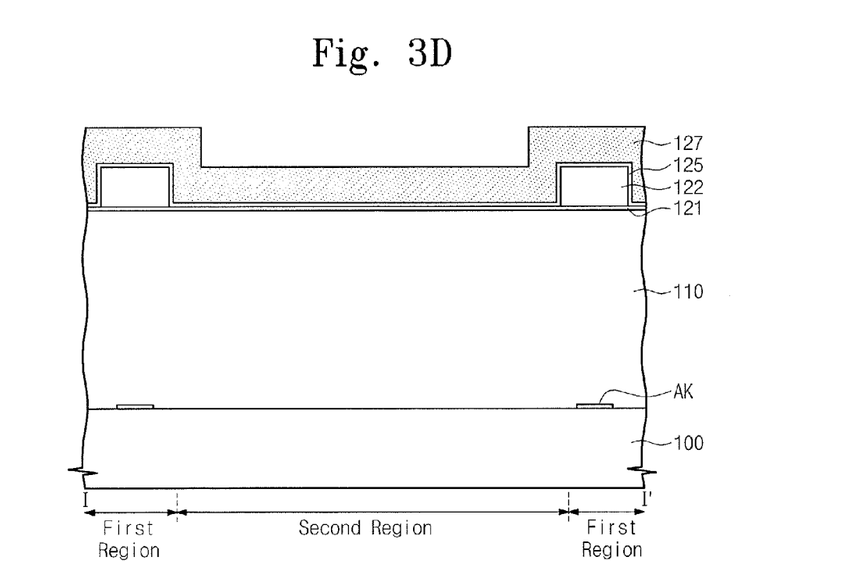

Referring to FIG. 3D, a second etch stop layer 125 and a second mask layer 127 may be formed on the first pattern 122.

The second etch stop layer 125 may include a material having an etch selectivity with respect to an etchant that will be used to etch the second mask layer 127. Further, the second etch stop layer 125 may include a transparent material. In example embodiments, the second etch stop layer 125 may include a silicon oxynitride layer.

The second mask layer 127 may include an amorphous silicon layer, and thus, it may be opaque. As shown, the second etch stop layer 125 and second mask layer 127 may be conformally formed on the first pattern 122 and first etch stop layer 121.

In example embodiments, the second mask layer 127 may exhibit refractive index of about 3.0 or more, when a light of about 633 nm wavelength is incident thereto.

Figure 3E:
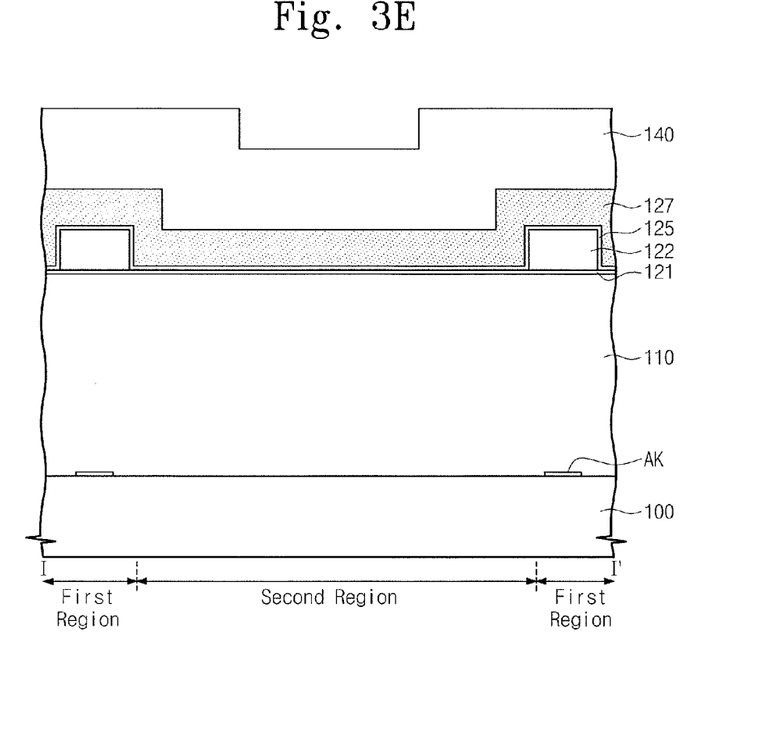

Referring to FIG. 3E, a sacrificial layer 140 may be formed on the second mask layer 127.

The sacrificial layer 140 may include an oxide material (e.g., tetra-ethyl ortho silicate (TEOS)).

Figure 3F:
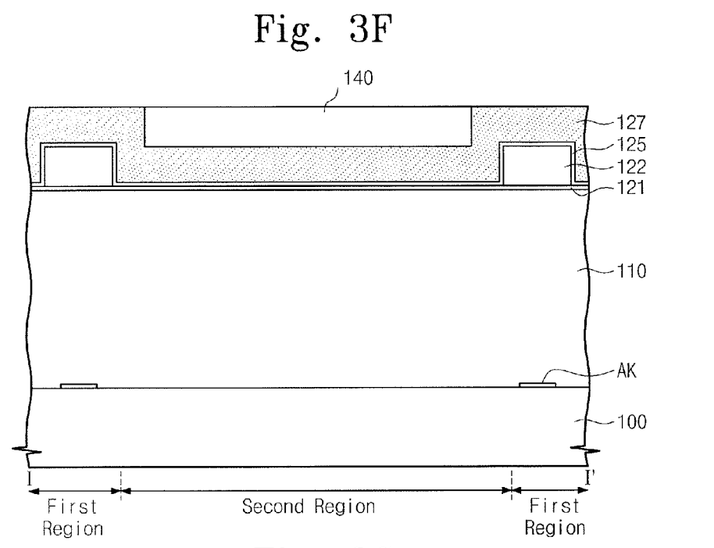

Referring to FIG. 3F, the sacrificial layer 140 may be polished to expose a top surface of the second mask layer 127. As shown, as the result of the polishing process, the sacrificial layer 140 may have a top surface that is substantially coplanar with that of the second mask layer 127.

In example embodiments, top surfaces of the polished sacrificial layer 140 and the exposed second mask layer 127 may be polished to expose a top surface of the second etch stop layer 125, and then, the second etch stop layer 125, the sacrificial layer 140, and the second mask layer 127 may be further polished to expose a top surface of the first pattern 122. As a result, a preliminary second pattern 128 may be formed between the plural ones of the first pattern 122, as shown in FIG. 3H.

Figure 3G:
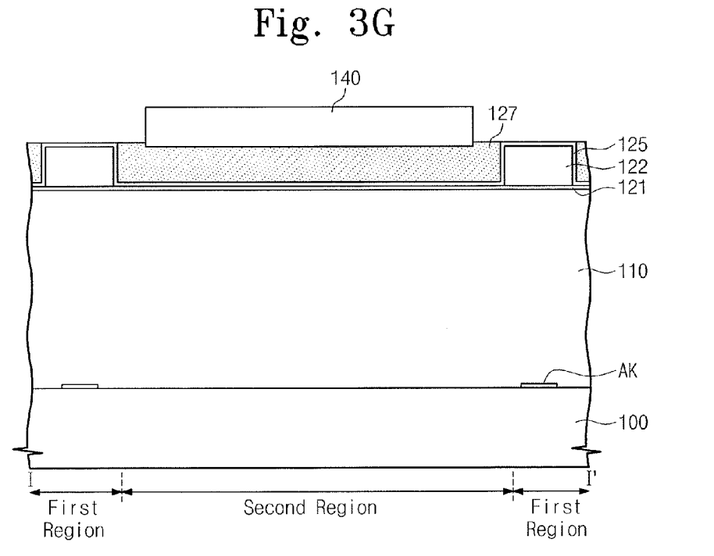
Figure 3H:
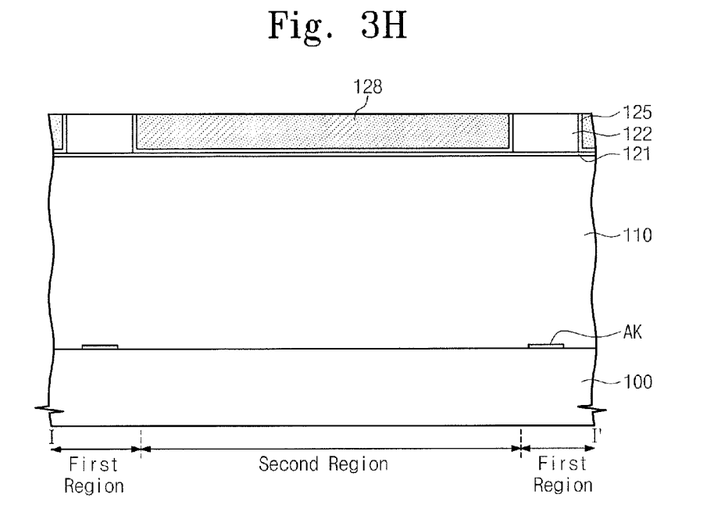

In other implementations, as shown in FIG. 3G, the exposed second mask layer 127 may be selectively etched-back to expose a top surface of the second etch stop layer 125. Referring to FIG. 3H, the sacrificial layer 140 may be etched-back in a wet etching manner to expose the second mask layer 127, and then, the remaining portion of the second etch stop layer 125 and the exposed second mask layer 127 may be polished to form the preliminary second pattern 128.

Figure 3I:
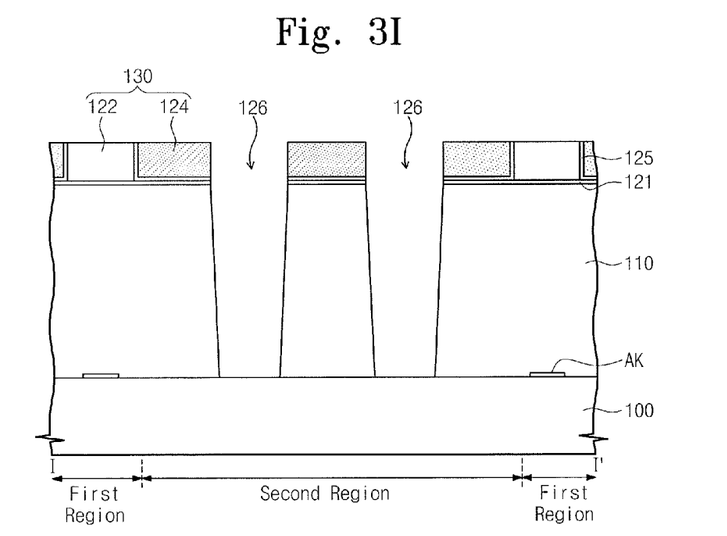

Referring to FIG. 3I, the preliminary second pattern 128 may be patterned to form the second pattern 124. Accordingly, the mask pattern 130 including the first and second patterns 120 and 124 may be formed on the first etch stop layer 121. Thereafter, the insulating layer 110 may be etched using the mask pattern 130 to form the hole 126. This process may be performed in the same manner as that of the previous embodiments described with reference to FIGS. 2C through 2F, and thus, a detailed description thereof will not be repeated.

As described above, the mask pattern 130, which may be used to form the hole 126 in the insulating layer 110, may include the transparent but uneven first pattern 122 and may also include the even second pattern 124 having the even surface. Accordingly, the hole 126 may be formed with a desired etching profile and at a desired position.

Figure 4A:
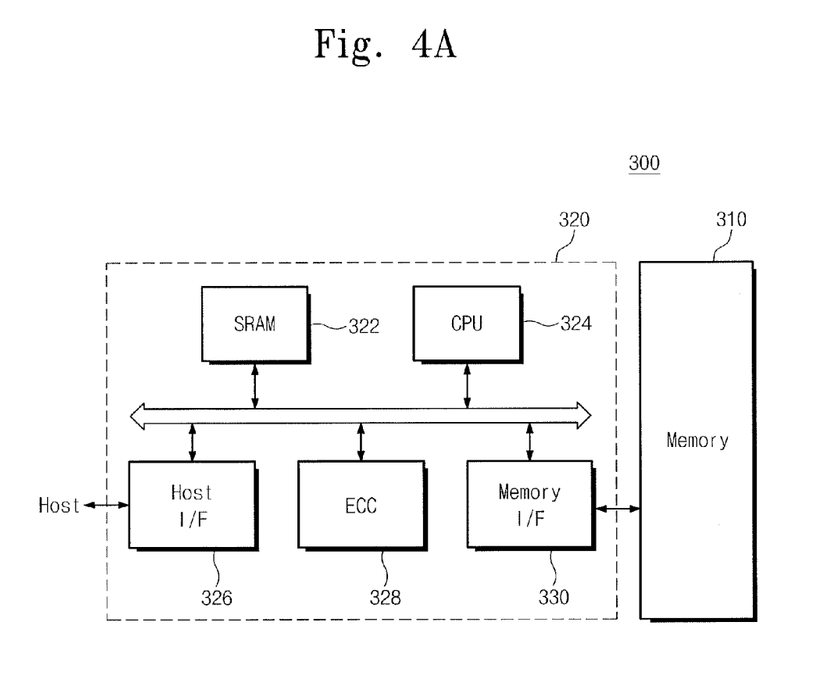
FIG. 4A illustrates a block diagram of a memory card including a semiconductor device according to example embodiments.

FIG. 4A illustrates a block diagram showing a memory card including a semiconductor device according to example embodiments.

Referring to FIG. 4A, a semiconductor device according to exemplary embodiments may be applied to form a memory card 300. The memory card 300 may include a memory controller 320 to control a data exchange between a host and a semiconductor device 310. A static random access memory 322 may be used as an operation memory of a central processing unit 324. A host interface 326 may include at least one data exchange protocol of the host connected to the memory card 300. An error correction code 328 may detect and correct at least one error that may be included in data read from the semiconductor device 310. A memory interface 330 may interface with the semiconductor device 310. The central processing unit 324 may control data exchange of the memory controller 320 with, for example, the semiconductor device 310.

The semiconductor device 310 in the memory card 300 may be a semiconductor device according to the exemplary embodiments. In this case, holes in the semiconductor device may be formed with a desired etching profile and at desired positions. Accordingly, it may be possible to increase the reliability of the semiconductor device and the memory card.

Figure 4B:
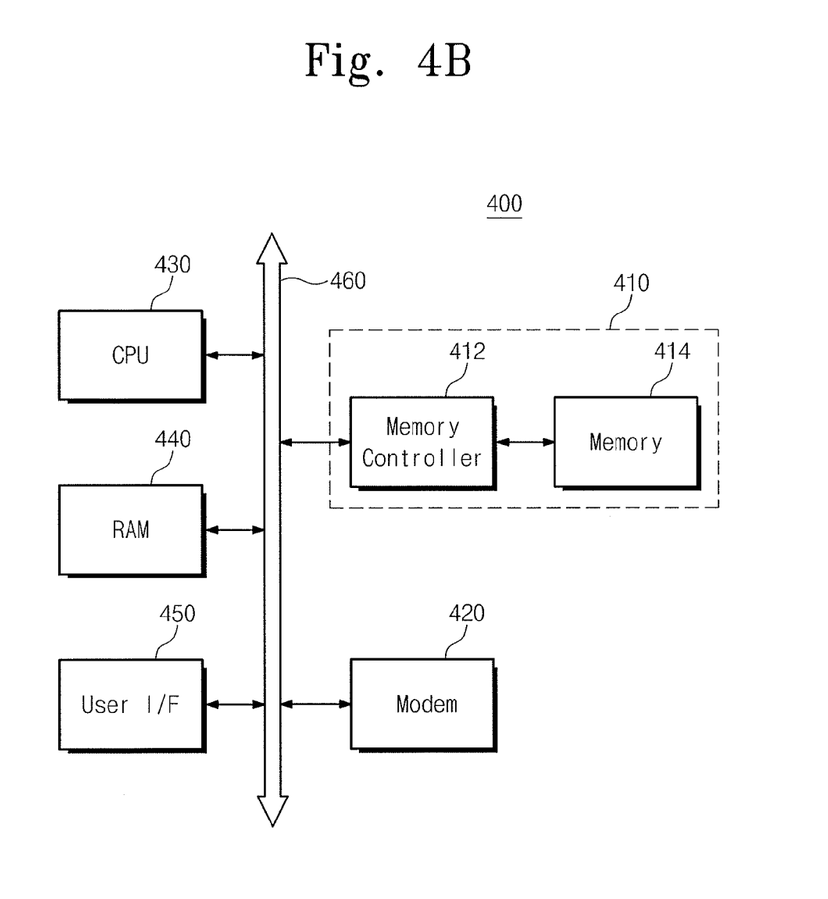
FIG. 4B illustrates a block diagram illustrating an information processing system including a memory device according to example embodiments.

FIG. 4B illustrates a block diagram showing an information processing system including a memory device according to example embodiments.

Referring to FIG. 4B, an information processing system 400 may include a semiconductor device according to exemplary embodiments. The information processing system 400 may include a mobile device or a computer. As an illustration, the information processing system 400 may include the memory system 410, a modem 420, a central processing unit (CPU) 430, a random access memory (RAM) 440, and a user interface 450 that are electrically connected to a system bus 460. The memory system 410 may store data processed by the central processing unit (CPU) 430 and data inputted from the outside (e.g., via the user interface 450 and/or the modem 420). The memory system 410 may include a memory 412 and a memory controller 414. The memory system 410 may be the same as the memory card 300 described with reference to FIG. 4A. The information processing system 400 may be provided as a memory card, a solid state disk, a camera image sensor, or an application chip set. For example, the memory system 410 may be a solid state disk (SSD). The information processing system 400 may stably and reliably store data in the memory system 410.

By way of summation and review, as a dimension of a semiconductor device is shrunk, a critical dimension (CD) of a storage contact of a capacitor decreases. To obtain a desired capacitance of the capacitor, a height of the capacitor may be increased. An etch mask is used to etch an interlayer dielectric and form a hole, where the capacitor will be provided. Due to the afore-described increase in height of the capacitor, it is desirable that the interlayer dielectric be formed to have an increased thickness. However, this may be difficult to achieve when the material for the etch mask is an oxide or nitride.

According to example embodiments, by using an amorphous silicon layer for the etch mask, an interlayer dielectric having an increased thickness may be readily realized. Thus, example embodiments provide methods of fabricating a semiconductor device with high density.

According to example embodiments, a mask pattern may be formed to include a transparent first pattern, through which an alignment key can be optically seen, and a second pattern to be used as an etch mask and have an even sidewall. Accordingly, a desired structure (e.g., hole) can be formed with a desired etching profile and at a desired position.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof as set forth in the following claims.

What is claimed is:

1. A method of fabricating a semiconductor device, the method comprising:
   forming an etch-target layer on a substrate having an alignment key;
   forming a transparent first pattern on the etch-target layer to face the alignment key, including:
      forming a mask layer containing an amorphous silicon layer, on the etch-target layer, and
      thermally treating a portion of the mask layer facing the alignment key to transform a portion of the amorphous silicon layer to a polysilicon layer;
   forming an opaque second pattern on the etch-target layer to be adjacent to the first pattern; and
   etching the etch-target layer using the first pattern and the second pattern as an etch mask.

2. The method as claimed in claim 1, wherein:
   the first pattern is formed to exhibit a refractive index of about 0.3 or less, when light of about 633 nm wavelength is incident thereto, and
   the second pattern is formed to exhibit a refractive index of about 3 or more, when light of about 633 nm wavelength is incident thereto.

3. The method as claimed in claim 1, wherein thermally treating the portion of the mask layer includes:
   providing an aperture mask on the mask layer to have an opening exposing the portion of the mask layer facing the alignment key, and
   selectively illuminating a laser beam onto the portion of the mask layer exposed by the opening.

4. The method as claimed in claim 1, wherein forming the second pattern includes patterning the mask layer containing the amorphous silicon layer.

5. The method as claimed in claim 1, wherein forming the first pattern includes:
   forming a first mask layer including an amorphous silicon layer on the etch-target layer,
   thermally treating the first mask layer to transform the amorphous silicon layer to a polysilicon layer, and
   patterning the first mask layer to form the first pattern.

6. The method as claimed in claim 5, wherein thermally treating the first mask layer is performed in a furnace.

7. The method as claimed in claim 5, wherein forming the second pattern includes:
   forming a second mask layer on the etch-target layer to fill a gap between plural ones of the first pattern and to include an opaque amorphous silicon layer, and
   patterning the second mask layer to form the second pattern.

8. The method as claimed in claim 5, wherein forming the second pattern includes:
   conformally forming a second mask layer including an amorphous silicon layer on the etch-target layer and plural ones of the first pattern,
   forming a sacrificial layer on the second mask layer,
   polishing the sacrificial layer to expose a top surface of the second mask layer, etching the exposed top surface of the second mask layer in an etch-back manner, etching the sacrificial layer in an etch-back manner, polishing the second mask layer to form a preliminary second pattern having a top surface that is coplanar with top surfaces of the plural ones of the first pattern, and patterning the preliminary second pattern to form the second pattern.

9. The method as claimed in claim 8, further comprising:

forming a first etch stop layer, before forming the first mask layer; and forming a second etch stop layer, before forming the second mask layer.

10. The method as claimed in claim 8, wherein the second pattern is formed to be in contact with sidewalls of the plural ones of the first pattern.

11. A method of fabricating a semiconductor device, the method comprising:

forming an etch-target layer on a substrate including a first region provided with an alignment key and a second region to be provided with a semiconductor device;

forming a mask pattern including a transparent first pattern and a second pattern, the transparent first pattern covering a portion of the etch-target layer facing the alignment key and a second pattern being used to form the semiconductor device;

etching the etch-target layer using the mask pattern as an etch mask to form a hole exposing a top surface of the substrate; and removing the mask pattern.

12. The method as claimed in claim 11, wherein:

the substrate includes a chip area and a scribe line area, the chip area including a cell region and a peripheral region, and the first region includes at least a portion of the scribe line area or the peripheral region.

13. The method as claimed in claim 11, wherein:

the first pattern includes a transparent polysilicon layer, and the second pattern includes an opaque amorphous silicon layer.

14. The method as claimed in claim 11, wherein:

the first pattern is formed to exhibit refractive index of about 0.3 or less, when light of about 633 nm wavelength is incident thereto, and the second pattern is formed to exhibit refractive index of about 3 or more, when light of about 633 nm wavelength is incident thereto.

15. A method of forming an etching mask, the method comprising:

forming an amorphous silicon layer on a substrate having an alignment key;

thermally treating the amorphous silicon layer to transform the amorphous silicon layer into a transparent polysilicon layer such that the alignment key becomes visible through the polysilicon layer;

patterning to form a first pattern from the polysilicon layer, the first pattern facing the alignment key; and forming a second pattern of amorphous silicon, the second pattern being adjacent to first pattern.

16. The method as claimed in claim 15, wherein;

thermally treating the amorphous silicon layer includes selectively illuminating a laser beam onto a portion of the amorphous silicon layer facing the alignment key such that only the portion of the amorphous silicon layer facing the alignment key is transformed into the polysilicon layer, and forming the second pattern includes patterning a remaining portion of the amorphous silicon layer not thermally treated.

17. The method as claimed in claim 15, wherein:

thermally treating the amorphous silicon layer includes transforming an entire portion of the amorphous silicon layer into a transparent polysilicon layer, patterning to form the first pattern includes removing portions of the polysilicon layer not facing the alignment key, and forming the second pattern includes depositing amorphous silicon on the substrate between plural ones of the first pattern and patterning the deposited amorphous silicon.

18. The method as claimed in claim 15, further including forming an etch-target layer on the substrate having the alignment key before forming the opaque amorphous silicon layer.

19. The method as claimed in claim 15, wherein;

the first pattern is formed to exhibit a refractive index of about 0.3 or less, when light of about 633 nm wavelength is incident thereto, and the second pattern is formed to exhibit a refractive index of about 3 or more, when light of about 633 nm wavelength is incident thereto.

* * * * *